United States Patent [19]

Allred et al.

[11] Patent Number: 4,654,224

[45] Date of Patent: Mar. 31, 1987

[54] METHOD OF MANUFACTURING A THERMOELECTRIC ELEMENT

[75] Inventors: David Allred; Krystyna Dec, both of Troy; Nancy Jackett, Westland; On Van Nguyen, Sterling Heights; Jaime Reyes, Birmingham, all of Mich.

[73] Assignee: Energy Conversion Devices, Inc., Troy, Mich.

[21] Appl. No.: 703,074

[22] Filed: Feb. 19, 1985

[51] Int. Cl.$^4$ .............................................. H01L 35/34
[52] U.S. Cl. ........................................ 427/34; 29/573; 204/38.4; 204/38.5; 204/48; 204/192.15; 156/646; 427/58; 427/89; 427/91; 427/92; 427/423
[58] Field of Search ................... 427/58, 89, 91, 92, 427/34, 423; 29/573; 204/192 SP, 38.4, 38.5, 48; 156/646

[56] References Cited

U.S. PATENT DOCUMENTS 4,489,742 12/1984 Moore .................................. 29/573

OTHER PUBLICATIONS

Nicolet, "Diffusion Barriers in Thin Films", *Thin Solid Films*, 52 (1978) pp. 415–443.

*Primary Examiner*—John D. Smith
*Attorney, Agent, or Firm*—Richard M. Goldman

[57] ABSTRACT

Disclosed are a thermoelectric device and method of making the device. The device has a plurality of thermoelectric elements electrically in series and thermally in parallel, where the individual thermoelectric elements have a thermoelectric body formed of macroscopically disordered material with electrical contact surfaces at opposite ends and a multi-layered diffusion barrier coating on the electrical contact surfaces.

30 Claims, 13 Drawing Figures

METHOD OF MANUFACTURING A THERMOELECTRIC ELEMENT

ART TO WHICH THE INVENTION RELATES

The invention relates to thermoelectric devices for the generation of electricity.

BACKGROUND OF THE INVENTION

The world supply of fossil fuel for the production of energy is being exhausted at an ever increasing rate. This has resulted in a continuing energy and economic crisis which impacts not only on the world's economy but on peace and stability. Solutions to the energy crisis include the development of new fuels and the development of more efficient technologies to utilize existing fuels. One method of more efficiently utilizing existing fuels, including energy conservation, power generation, environmental protection, and economic growth, is the thermoelectric generation of electricity.

In the thermoelectric generation of electricity electrical power is generated by heat. It has been estimated that two-thirds of all energy, for example from automobile exhausts, fossil fuel power plants, and the like is discharged to the environment without further recovery. This so called waste heat is paid for and then discharged into the environment without use. Employment of waste heat for the generation of electricity can provide a direct reduction in thermal polution and an increase in economically efficient utilization of fuels, independent of the original source of the thermal energy.

The performance of a thermoelectric device can be expressed in terms of a figure of merit (Z) for the material forming the device. Z is defined by the relationship:

$$Z = S^2 (K \text{ sigma})$$

where
- Z is a dimensionless quantity,
- S is the Seebeck coefficient in microvolts per degree centigrade,
- K is the thermal conductivity in milliwatts per centimeter per degree centigrade, and sigma is the electrical conductivity in reciprocal (ohm-centimeters).

In order for a material to be suitable for thermoelectric power generation, the thermoelectric power coefficient, that is the Seebeck coefficient, S, must be high, the electrical conductivity, sigma, must be high, and the thermal conductivity, K, must be low.

The thermal conductivity, K, has two components, $K_1$, the lattice component, and $K_e$, the electrical component. In non-metals the lattice component, $K_1$, dominates and it is this component which mainly determines the value of K.

Therefore, in order for material to be efficient for thermoelectric power conversion, charge carriers must diffuse easily through the hot junction to the cold junction while maintaining a temperature gradient between the two junctions. Thus high electrical conductivity is required along with low thermal conductivity.

Historically, thermoelectric power conversion has not found wide commercial usage. The major reason for this has been that thermoelectric materials which were suitable for commercial applications have been crystalline. Those crystalline materials which are best suited for thermoelectric devices have been difficult to manufacture because of poor mechanical properties and extreme sensitivity of material properties to macroscopic compositional changes. This is because prior art crystalline thermoelectric materials contain a predominace of chalcogenide elements, tellurium and selenium. Tellurium and selenium are natural glass formers. It is because of this tendency of tellurium and selenium to form glasses that the growth, control, and mechanical stability of prior art thermoelectric crystalline materials has been substantially non-reproducible.

The chalcogenides, such as tellurium, only grow high quality single crystals with great difficulty. Even when tellurium containing single crystals are grown, the crystalline materials are unstable materials with large defect densities, and compositions far from stoichiometric. For these reasons, controlled doping has proven to be extremely difficult.

Moreover, crystalline solids have been unable to attain large values of electrical conductivity and, simultaneously, low thermal conductivity.

The polycrystalline thermoelectric materials are $(Bi, Sb)_2 (Se,Te)_3$, $PbTe$, and $Si-Ge$. The bismuth-antimony tellurides represent a continuous solid system in which the relative amount of bismuth and antimony are from 0 to 100%. Polycrystalline materials also present problems in that the polycrystalline materials have polycrystalline grain boundaries, resulting in relatively low electrical conductivities. Moreover, fabrication of polycrystalline thermoelectric materials into suitable thermoelectric devices have presented difficulties.

Improved thermoelectric materials have been developed which are not single phase crystalline materials, but are instead, disordered materials. These materials, more fully disclosed in copending U.S. application Ser. No. 341,864 filed Jan. 22, 1982 in the names of T. J. Jayadev and On Van Nguyen for *New Multiphase Thermoelectric Alloys and Methods Of Making The Same* now abandoned and replaced by U.S. Ser. No. 412,306 filed Aug. 27, 1982, now U.S. Pat. No. 4,447,277, issued May 8, 1984 incorporated herein by reference. The materials of Jayadev and Nguyen are multiphase materials having both amorphous and multiple crystalline phases. These materials are good thermal insulators, and include grain boundaries of various transitional phases varying in composition from the composition of matrix crystallites to the composition of the various phases in the grain boundary region. The grain boundaries are highly disordered with the transitional phases including phases of high thermal resistivity to provide high resistance to thermal conduction. The materials of Jayadev and Nguyen have grain boundaries defining regions which include conductive phases therein, providing numerous electrical conduction paths through the bulk material for increasing electrical conductivity without substantially affecting thermal conductivity. In essence, the materials have all the advantages of polycrystalline material, with desirably low conductivities and crystalline bulk Seebeck properties. Moreover, the disordered multiphase materials also have high electrical conductivity. Thus, the materials of Jayadev and Nguyen have an $S^2$ (sigma) product for the figure of merit which can be independently maximized with desirably low thermal conductivities for thermoelectric power generation.

The materials of Jayadev and Nguyen are fabricated in a manner which introduces disorder into the material on a macroscopic level. This disorder allows various phases, including conductive phases, to be introduced into the materials.

Commonly assigned copending U.S. application Ser. No. 414,917 filed Sept. 3, 1982 by T. J. Jayadev, On Van Nguyen, Jaime M. Reyes, H. Davis, and M. W. Putty, (hereinafter "Jayadev et al") now U.S. Pat. No. 4,588,520 incorporated herein by reference, describes compacted and/or compressed powder materials useful for thermoelectric applications. The powdered materials have compositional disorder, translational disorder, configurational disorder, and other disorders introduced therein. The powder materials are multiphase alloy materials having a first phase, including matrix crystallites bounded by disordered grain boundaries at various phases including transitional phases. Between the grain boundaries are macroscopic grain boundary regions which also include various phases, including electrically conductive phases and crystalline inclusions. The grain boundary regions are rich in electrically conducting modifying phases which provide high electrical conductivities. The other phases in the grain boundary regions and the grain boundaries provide low thermal conductivities.

The compacted materials further include additional bulk disorder between the interfaces of the compacted powder particles which further reduce thermal conductivity. The materials comprise a body formed from compacted powder material. The compacted material includes bismuth, tellurium, and at least one highly electrically conductive phase.

The materials described in Jayadev et al. are made by forming a mixture containing the constituent elements of a first compound including at least bismuth and tellurium and constituent elements of a second compound capable of forming at least one highly electrically conductive phase, and thereafter compressing at least a portion of the particulate mixture to form a compacted body of the material. The first and second compounds may be separately prepared from the respective constituent elements, and then the first and second compounds combined and heated to form a melt, with the melt cooled, to form a solid material form which is crushed to form the particulate material.

Alternately, a melt may be formed from the second compound and the constituent elements of the first compound and then cooled, for example by planar flow casting, to a solid material form and crushed to form the particulate mixture. According to a further alternative, the first and second compounds, that is the bismuth and tellurium compound, and the compound capable of forming at least one highly electrically conductive phase, may be separately prepared from their respective constituent elements and separately crushed into particulate form to form the particulate mixture.

The first compound includes bismuth, antimony, and tellurium for making a p-type material and bismuth, tellurium, and selenium for making an n-type material. The second compound, to be combined with either of the first compounds, that is, with either the p-type material or the n-type material, includes silver, antimony, and tellurium.

Individual thermoelectric elements of the n-type drive negative carriers from the hot side of the device to the cold side of the device, while individual thermoelectric elements of the p-type conductivity drive positive carriers from the hot side of the device to the cold side of the device. Operative thermoelectric devices are characterized by a plurality of thermoelectric elements, thermally in parallel and electrically in series. N-type elements and p-type elements of the thermoelectric device are assembled so that they are thermally in parallel and electrically in series with one another. Each pair of elements contain one n-type thermoelectric element and one p-type thermoelectric element electrically connected at one end by an electrical connecting strap. Each strap connects the end of an n-type element of each pair of electrically connected thermoelectric elements to the p-type element of the next adjacent pair of electrically connected thermoelectric elements. Thus, all of the individual n-type and p-type thermoelectric elements of a thermoelectric device are connected electrically in series and thermally in parallel. In order to achieve maximum power output for a thermoelectric device, the electrical resistance of both the individual strap and of the thermoelectric device to strap contact must be minimized.

The preferred solders for temperatures of intended use are solders containing, inter alia, one or more of gold, silver, lead and tin. The materials of this solder as well as the high concentration of tellurium in the individual thermoelectric body gives rise to the in-migration of solder material, for example tin, and/or the out-migration of elements, for example, selenium, tellurium, and antimony from the thermoelectric body. The effects of either or both of the in-migration of solder material to the thermoelectric body, and the out-migration of the elements from the thermoelectric body, attacks and weakens the solder joint between the thermoelectric body and the straps. This is initially evidenced by a high contact resistance, a decrease in an apparent figure of merit, Z, for the individual element which is the result of changes in stoichiometry thereof, and, ultimately, by physical failure of the joint.

The migration problem, including one or both of in-migration of solder material to the thermoelectric body and out-migration of elements from the thermoelectric body, is sharply temperature dependent and is a more severe problem on the hot side of a thermoelectric device.

Attempts to solve the problems of migration have typically involved the use of barrier layers between the straps and the thermoelectric elements. However, such barriers have not been totally satisfactory, and diffusion remains a major problem in thermoelectric generators.

SUMMARY OF THE INVENTION

We have made a number of observations with respect to both prior art barrier layers and novel diffusion barriers contemplated herein that are unexpected and appear to be in contradiction to Fick's Law, i.e., Flux = Diffusivity × Concentration Gradient, and to the series statement of Fick's Law, where $X/D^* = \text{SUM} (X_i/D_i),$ $D^*$ being the total diffusion coefficient of the multilayer diffusion barrier, X being the total thickness of the diffusion barrier layer, the $D_i$'s being the individual diffusion coefficients of the individual layers, and the $X_i$'s being the individual layer thicknesses. These observations show a higher activation energy for the out migration (exo diffusion) of tellurium through a modulated structure, multi-layer, multimaterial diffusion barrier than for the individual layers making up the barrier. These observations specifically show: (1) that the rate of migration is significantly lower through a modulated structure, multiple material, multi-layer, diffusion barrier coating having many thin layers than a multi-layer diffusion barrier layer of the same total thickness, but having a smaller number of thicker layers; (2) that the rate of migration is lower through a modulated structure diffusion barrier coating where the layers are of several different materials than an equivalent diffusion barrier coating of the same total thickness, layer thickness, and number of layers, where the layers are all of the same material; and (3) a surprising difference in the activation energy of diffusion for a multi-layer coating compared to a single layer coating of the same total thickness.

While not wishing to be bound by this model, it is believed that the ex-migration of tellurium into the solder and the in-migration of solder material into the thermoelectric element occurs along growth or grain boundaries, and through defects, voids, and holes in the diffusion barrier coating. One postulated mechanism is that the diffusing species preferentially diffuses along boundaries, following a relatively direct path from regions of high concentration to regions of low concentration.

The invention herein contemplated utilizes deposition techniques and multi-layer diffusion barrier coatings, especially modulated structure, multiple component, multi-layer diffusion barrier coatings, to reduce the creation, propagation, and growth of diffusion pathways through the diffusion barrier coating, to heal defects in one layer with material from a superjacent layer, and to require the diffusing species to follow a circuitous path through the coating along grain boundaries, and layer interfaces.

According to the invention herein contemplated there is provided a thermoelectric element having a thermoelectric body and a deposited diffusion barrier coating amenable to high volume, low cost fabrication. Preferably, the barrier is a modulated structure diffusion barrier carrier coating, e.g., a multi-layer diffusion barrier coating where each layer has been separately deposited and preferably separately annealed. The thermoelectric body is preferably formed of a macroscopically disordered tellurium containing alloy, although the modulated structure, multi-layer diffusion barrier is also useful with monocrystalline, polycrystalline, and compressed powder thermoelectric elements and devices.

In a preferred exemplification a modulated structure, multi-layer diffusion barrier coating is preferred. This is to substantially avoid propagation of holes, voids, and cracks through the coating. That is, for diffusion barrier coatings of substantially equal thickness, the multi-layer coating has fewer defects and diffusion channels extending through the entire coating. Moreover, multi-layer coatings are less susceptible to delamination from the thermoelectric body, e.g., thermal stress induced delamination, then single layers of comparable thickness.

In one exemplification the coating is a single layer, e.g., of nickel or cobalt. Preferably the diffusion barrier coating is a multi-layer coating, e.g., of nickel, or of cobalt, or of cobalt and nickel.

In one exemplification the multi-layer diffusion barrier coating has at least one nickel containing layer. The nickel containing layer is a first nickel layer directly on the thermoelectric body. In a preferred embodiment of this exemplification the multi-layer diffusion barrier coating has at least three layers, one of the layers being the first nickel layer on the thermoelectric body, one of the layers being a cobalt layer in contact with the first nickel layer, and one of the layers being a second nickel layer. The second nickel layer may either be on the cobalt layer, or separated from the cobalt layer by an intervening layer. In a three layer coating the second nickel layer is an external layer on the cobalt layer.

In an alternative embodiment the multi-layer coating has a cobalt layer deposited directly on the thermoelectric body. Subsequent layers may be nickel layers, cobalt layers, or alternating nickel and cobalt layers.

In an embodiment having four or more layers, any or all of the layers may be nickel or cobalt layers. The nickel layers may alternate with cobalt layers. In an alternative exemplification all of the layers may be nickel or cobalt, i.e., there need not be hetero-layers, as long as all of the layers are individually deposited, and preferably individually annealed, whereby to avoid propagation of holes, voids, and cracks through the coating.

Each of the individual layers are thick enough to substantially conformally coat the substrate and all previous layers, leaving essentially no holes or thin areas, and to coat any defects from previous depositions. In an embodiment having nickel, cobalt, and nickel layers, the first nickel layer is preferably from about 0.5 to about 3.0 microns thick, the cobalt layer being about 0.08 to about 0.5 microns thick, and the second nickel layer, being about 0.5 to about 3.0 microns thick.

In a particularly preferred exemplification the multi-layer diffusion barrier coating is present on electrical contact surfaces of the thermoelectric body and substantially absent from the rest of the body, whereby to avoid the formation of electrical shunt paths along the surface of the thermoelectric body.

The preferred materials for the layers of the diffusion barrier coating are solderable, substantially non-reactive with the solder and the tellurium-containing thermoelectric body, and have a coefficient of thermal expansion compatible with that of the tellurium containing thermoelectric body.

The thermal compatibility of the materials making up the modulated structure diffusion barrier is a function of both the thickness of the individual layer and of its coefficient of thermal expansion. For example, the individual layers of the diffusion barrier coating may be relatively thick layers or films of materials having a coefficient of thermal expansion of from about $13 \times 10^{-6}$ per degree Centigrade to about $18 \times 10^{-6}$ per degree Centigrade. Typically such layers are above about 0.5 microns thick. Alternatively, individual layers of the diffusion barrier may be relatively thin layers or films of materials having coefficients of thermal expansion of less than about $13 \times 10^{-6}$ per degree Centigrade or greater than $18 \times 10^{-6}$ per degree Centigrade. Such thin films generally have a thickness of from about 0.08 to about 0.5 micron.

Exemplary materials include iron, cobalt, nickel, palladium, gold, and alloys thereof. The individual layers may be deposited by sputtering, evaporation, electroless deposition, electrolytic deposition, and chemical vapor deposition.

Also contemplated herein is a thermoelectric device having a plurality of individual thermoelectric elements, i.e., n-type elements and p-type elements, electrically in series and thermally in parallel through straps. The individual thermoelectric elements preferably comprise a thermoelectric body formed of a macroscopically disordered tellurium containing alloy, and having a multi-layer diffusion barrier thereon, although the elements may be formed of monocrystalline, polycrystalline, or compressed powder materials. The individual thermoelectric element is formed of a tellurium alloy that may further contain e.g., arsenic, antimony, bismuth, selenium, and sulfur, inter alia.

In a preferred exemplification, the modulated structure, multi-layer diffusion barrier coating has at least one nickel containing layer which is preferably a first nickel layer directly on the thermoelectric body. In this exemplification modulated structure, the multi-layer diffusion barrier coating contains at least three layers, one of the layers being the first nickel layer on the thermoelectric body, and next the layer being a cobalt layer in contact with the nickel layer. The second nickel layer may be either on the cobalt layer, or separated from the cobalt layer by an intervening metal layer. The second nickel layer may be an external layer. Alternatively, there may be other layers above the second nickel layer.

Alternatively, all of the layers may be nickel or cobalt, i.e., there need not be hetero layers, as long as all of the layers are individually deposited and preferably individually annealed, whereby to substantially avoid propagation of defects therethrough.

The contemplated thermoelectric device has modulated structure diffusion barrier layers interposed between the thermoelectric elements and the straps whereby to avoid in-migration of solder material to the thermoelectric body and out-migration, of e.g., tellurium and other elements from the thermoelectric body. The diffusion layer is less critical on the other surfaces of the individual thermoelectric element, i.e., serving only to block environment-thermoelectric body interactions. Thus, in a preferred embodiment the non-conducting surfaces of the thermoelectric elements are substantially free of diffusion barrier layer material and corrosion products, whereby to avoid the formation of shunt paths. In another exemplification the barrier layer is thin enough to avoid low resistance shunt paths, but thick enough on the non-contacting, non-conducting sides to provide a corrosion resisting layer, coating, or film.

According to further exemplification of the invention disclosed herein there is provided a method of forming the thermoelectric elements herein contemplated. The method contemplates electroless deposition of the nickel layer from, for example, a hypophosphite solution, with subsequent chemical vapor deposition and/or electroless deposition of other layers, and annealing between the deposition of each layer. Both the nickel and cobalt layers can be deposited by electroless deposition, for example from hypophosphite solution. Alternatively, the nickel layers, or the cobalt layers, or the nickel and the cobalt layers may be deposited by chemical vapor deposition, for example the cobalt from cobalt carbonyl and cobalt tri carbonyl nitrosyl, and the nickel from nickel carbonyl.

Alternatively, with the use of an appropriate jig or die, where the individual thermoelectric bodies are held in compression along the surfaces not intended to be coated, the multi-layer diffusion barrier coating may be applied to only the strap contact surfaces thereof.

After assembly of the thermoelectric device, the diffusion barrier layer is preferably partially or substantially removed from those surfaces of the thermoelectric element not having electrical contact with the straps, for example by dry etching where the exposed surfaces of the thermoelectric elements are activated and then contacted with carbon monoxide to form carbonyls of barrier layer material.

THE FIGURES

DETAILED DESCRIPTION OF THE INVENTION

Figure 1:
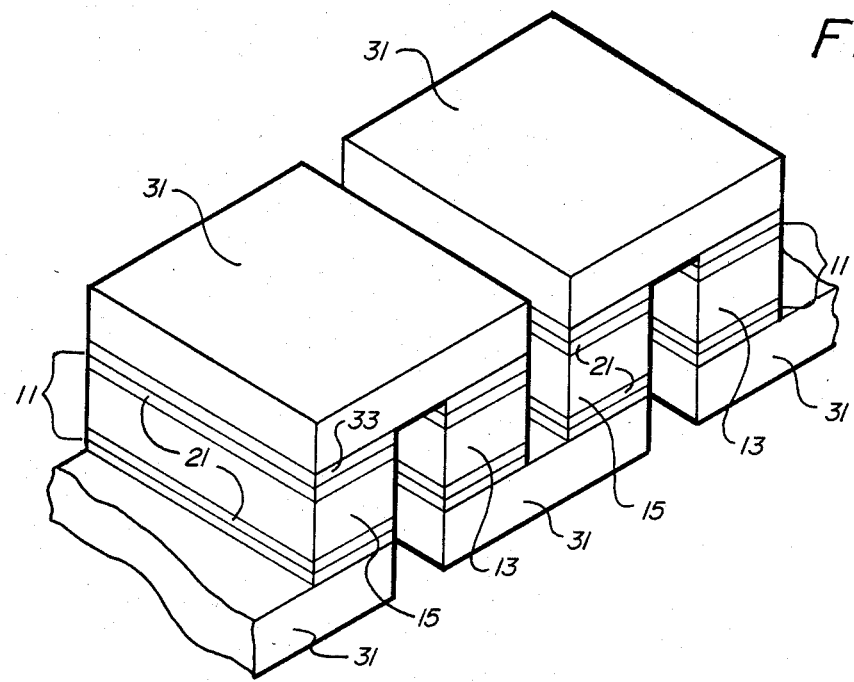
FIG. 1 is an isometric, schematic view of a thermoelectric device of the invention.
Figure 2:
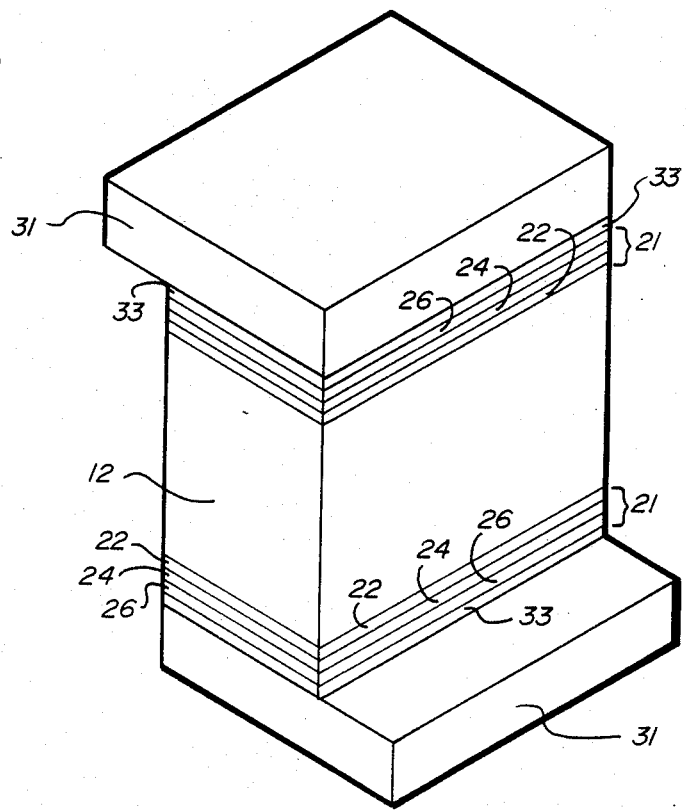
FIG. 2 is an isometric, schematic view of an individual thermoelectric element and the individual strap, showing the relationship of the coatings to the element.

A thermoelectric device of the contemplated invention is shown in FIGS. 1 and 2. The thermoelectric device 1 has a plurality of thermoelectric elements 11 electrically in series through straps 31 and thermally in parallel with respect to a heat source, not shown, and a heat sink, not shown. The thermoelectric elements 11 of the thermoelectric device 1 are assembled thermally in parallel and electrically in series with one another. Each pair of one n-type element 13 and one p-type element 15, electrically connected at one end by a connecting strap 31 form a pair. The thermoelectric device 1 also has further electrical connecting straps at the opposite end of the thermoelectric elements 13 and 15. A strap 31 connects the end of an n-type element 13 of each pair of electrically connected thermoelectric elements 13 and 15 to the p-type element 15 of the next adjacent pair of electrically connected thermoelectric elements 11. In this way all of the thermoelectric elements 11 of the thermoelectric device, that is all of the n-type thermoelectric elements 13 and all the p-type thermoelectric elements 15, are connected electrically in series. The individual thermoelectric elements 11 are connected to the straps 31 through soldered joints 33. Interposed between the solder material 33 and the individual thermoelectric element 11 is a diffusion barrier layer, shown generally as 21.

An individual thermoelectric element 11 is shown with respect to the straps 31 in FIG. 2. As there shown, the individual thermoelectric element 11 includes thermoelectric body 12 with individual layers 22, 24, 26 of the diffusion barrier coating 21.

In a preferred exemplification the thermoelectric body 12 is formed of a macroscopically disordered tellurium alloy in which the tellurium is subject to both out-migration out of the thermoelectric body 12 and damage by in-migration of solder materials to the thermoelectric body 12. However, the method and structure of the invention is also useful with monocrystalline, polycrystalline, and compressed powder thermoelectric bodies.

Typical p-type thermoelectric alloys include bismuth-antimony-tellurium alloys, such as $Bi_{10-20}$ $Sb_{20-30}$ Te$_{50-70}$, optionally with up to about 1 atomic percent silver.

Typical n-type thermoelectric alloys include bismuth-selenium-tellurium alloys, such as Bi$_{30-40}$ Se$_{2-10}$ Te$_{40-60}$.

In a preferred exemplification the thermoelectric body itself is formed of a macroscopically disordered alloy. By a macroscopically disordered alloy is meant an alloy having the substantial absence of long range order. The alloy may be amorphous, microcrystalline, polycrystalline, or a combination thereof, with crystalline inclusions. Moreover, the alloy may have different composition at grain boundaries, interfaces, and the like. Alternatively, the invention is useful with monocrystalline, polycrystalline, and compressed powder thermoelectric elements.

The thermoelectric element 11 includes two electrical contact surfaces. It is through these surfaces that electrical contact is made between the straps 31 and the thermoelectric element 11.

The thermoelectric element 11 includes a modulated structure diffusion barrier coating on the contact surfaces between the thermoelectric body 12 and the straps 31 whereby to prevent out-migration of tellurium from the thermoelectric body 12 and in-migration of solder material from the solder joint 33 to the thermoelectric body 12. The diffusion barrier coating may be a single layer, as a layer of a material that is substantially non-reactive with the thermoelectric body, solderable, substantially non-reactive with the solder, and having a coefficient of thermal expansion compatible with that of the thermoelectric body, as iron, cobalt, nickel, gold, palladium, and alloys thereof.

In a preferred exemplification, the modulated structure diffusion barrier coating is a multi-layer coating. The multi-layer diffusion barrier coating includes separately deposited, preferably separately annealed layers. Preferably the layers are of multiple components which interact to reduce the flux of tellurium and solder material across the boundary. The materials are preferably substantially non-reactive with the thermoelectric body and the solder, solderable, and have compatible coefficient of thermal expansion with the thermoelectric body. Moreover, the combination of separately deposited and annealed layers, preferably of different materials, substantially prevents propagation of defects and diffusion paths through the multi-layer diffusion barrier coating.

The preferred materials for forming the modulated structure, multicomponent, multi-layer diffusion barrier coating differ from one another in one or more of solidification, deposition, grain growth or nucleation modes, pattern of grain growth, and/or morphology of grain growth. The separately deposited, separately annealed layers conformally coat subjacent layers inhibit the columnar propagation, development and growth of defects, voids, grain boundaries and diffusion paths from one layer to the next. In this way, the heterogeneity of the modulated structure promotes synergistic nucleation of non-isostructural layers, thereby preventing propagation of defects and diffusion paths through the multi-layer diffusion barrier coating.

The materials useful in providing the layers are iron, cobalt, nickel, gold, palladium, and alloys thereof.

In a particularly preferred exemplification the layer 22 directly in contact with the thermoelectric body 12 is a nickel containing layer in direct thermal and electrical contact with thermoelectric body 12. The nickel containing layer is typically from about 0.5 microns to about 3.0 microns in thickness. While nickel reacts with the tellurium body to form brittle compounds, the presence of a layer of a different material atop the nickel layer, especially when the nickel layer is a thin layer, appears to retard the growth of the brittle compounds through the multi-layer diffusion barrier coating.

The thermal compatibility of the modulated structure diffusion barrier layer is a function of both the thicknesses of the individual layers and of their coefficients of thermal expansion.

In a preferred exemplification a heterolayer nonreactive with the thermoelectric body is placed atop a nickel containing layer. The heterolayer atop the nickel containing layer, with cobalt preferred, is from about 0.08 to about 0.5 micron thick. The thickness of the individual layers and of the multi-layer coating is limited by thermal stress and concomitant stress delamination. For this reason, as well as its resistance to corrosion cobalt is preferred because the coefficient of thermal expansion thereof closely matches that of the nickel layer and of the thermoelectric body. While nickel's coefficient of thermal expansion is about $12 \times 10^{-6}$ per degree centigrade, cobalt's coefficient of thermal expansion is about $14 \times 10^{-6}$ per degree centigrade, and the thermoelectric body's coefficient of thermal expansion is about $16 \times 10^{-6}$ per degree centigrade.

The individual layers of the diffusion barrier coating may be relatively thick layers or films of materials having a coefficient of thermal expansion of from about $13 \times 10^{-6}$ per degree Centigrade to $14 \times 10^{-6}$ per degree Centigrade to about $17 \times 10^{-6}$ per degree Centigrade to $18 \times 10^{-6}$ per degree Centigrade. These materials include, among others, iron, cobalt, nickel, gold, and alloys thereof. Typically such layers are above about 0.5 microns thick, for example up to about 3.0 microns in thickness.

Alternatively, individual layers of the diffusion barrier may be relatively thin layers or films of materials having coefficients of thermal expansion of less than about $13 \times 10^{-6}$ per degree Centigrade to $14 \times 10^{-6}$ per degree Centigrade or greater than about $17 \times 10^{-6}$ per degree Centigrade to $18 \times 10^{-6}$ per degree Centigrade. These materials include molybdenum, tungsten, chromium, and alloys thereof. Such thin films generally have a thickness of from about 0.08 to about 0.5 micron.

It is to be understood that the modulated structure, multicomponent, diffusion barrier coating may include combinations of individual layers of high thermal expansion coefficient materials and low thermal expansion coefficient materials, particularly when the resultant composite thermal expansion coefficient of the coating approaches that of the thermoelectric element.

According to a still further exemplification, the individual layers may be alloys of tailor-made stochiometry, having coefficients of thermal expansion and thicknesses intended to optimize other parameter and/or manufacturing steps.

In alternative exemplifications, very thin layers, e.g., less then 0.5 micron thick of a material substantially non-reactive with, e.g., the thermoelectric body or the solder, and with a non-compatible coefficient of thermal expansion. Additionally there may be one or more additional layers atop the intermediate layer, for example an additional layer of nickel from about 0.5 to about 3 microns thick.

The individual layers may be deposited, e.g., by thermal spraying, plasma spraying, sputtering, evaporation, electrolytic deposition, electroless deposition, or chemical vapor deposition. For example successive layers of cobalt, nickel, cobalt and nickel may be deposited by chemical vapor deposition, or successive layers of nickel, cobalt, and nickel may be deposited by electroless deposition.

In a particularly preferred exemplification the multilayer diffusion barrier coating is substantially removed from surfaces other than the electrical contact surfaces of the individual thermoelectric element. This is to avoid short circuit or shunt paths between the straps 31 across opposite surfaces of the thermoelectric element 11. According to this further exemplification of the invention, removal of the coating is carried out to the extent necessary to increase the resistance of the shunt path while leaving a corrosion resistant layer, coating, or film on the element. In this way a further increase of electrical conversion efficiency of about 15% to 30% may be obtained.

Figure 3A:
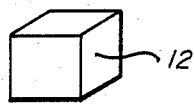
FIGS. 3a through 3h illustrate the manufacturing sequence for the thermoelectric device herein contemplated, being shown with respect to one thermoelectric element.

According to the invention herein contemplated there are provided methods for the manufacture of thermoelectric element and thermoelectric device. These are shown schematically in FIGS. 3a through 3h. In FIG. 3a a thermoelectric body 12 is shown. The thermoelectric body may be formed, for example by any of the techniques described in the aforementioned patent applications of Jayadev and Nguyen or of Jayadev et al. These include such methods as planar flow casting, and comminution and compaction. The resulting thermoelectric body 12 then has a nickel film of about 0.8 to about 3.0 microns thick and substantially free of pin-hole defects deposited thereon, for example by electroless deposition. Electroless deposition is shown in FIG. 3b where the individual thermoelectric device 12 is immersed in a deposition tank of nickel hypophosphite solution and the nickel hypophosphite is reduced whereby to deposit nickel 22 on the thermoelectric body 12. This results in the formation of a substantially uniform layer 22. After electroless deposition from hypophosphite solution the thermoelectric device including, the nickel film 22, is annealed.

When annealing is referred to herein, it is typically carried out in a non-oxidizing atmosphere, e.g., an inert, $N_2$, or $H_2$, atmosphere, at temperatures of from about 200° C. to about 275° C. for about 10 minutes to about several hours. In this way the porosity of the layer is decreased, and the adhesion of the layer to the subjacent layer is increased.

Figure 3E:
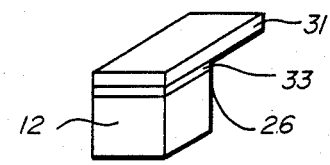
Figure 3B:
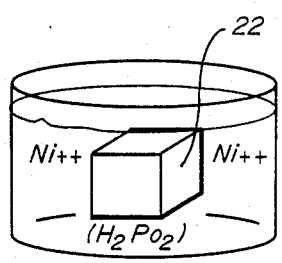
Figure 3F:
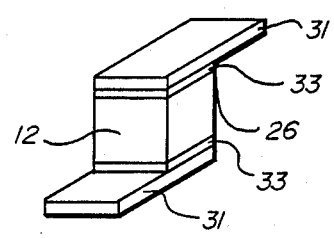
Figure 3C:
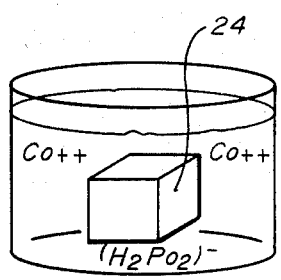

Thereafter, as shown in FIG. 3c the cobalt film is deposited. In FIG. 3c the cobalt film is shown as being deposited by electroless deposition, for example from cobalt hypophosphite solution. Alternatively, the cobalt film may be deposited by chemical vapor deposition, for example by chemical vapor deposition of $Co_2(CO)_8$ or chemical vapor deposition of $Co(CO)_3$-(NO). After deposition of the cobalt film 24 the thermoelectric body 12 is again annealed, as described above.

Figure 3G:
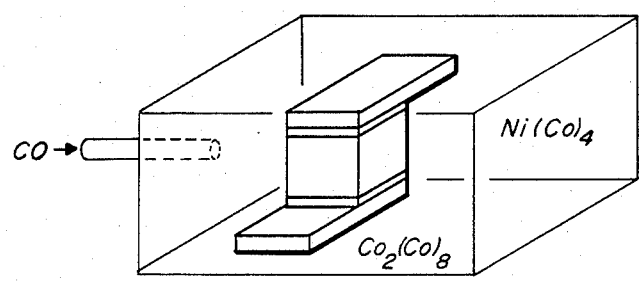
Figure 3D:
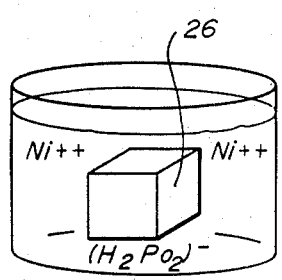

Thereafter, as shown in FIG. 3d, the nickel and cobalt coated thermoelectric body 12 is coated with a further coating 26. This is shown in FIG. 3d as being formed by electroless deposition from hypophosphite solution and subsequent annealing.

In FIGS. 3e and 3f the top and bottom straps 31 are applied at soldered joints 33.

Thereafter, the shunt paths, formed by the multi-layer coating 21 are substantially totally or partially removed by dry etching. As shown in FIG. 3g the dry etching is with carbon monoxide under conditions of temperature and pressure that result in the formation of nickel carbonyls and cobalt carbonyls.

Dry etching is carried out with carbon monoxide at temperatures high enough to cause etching but low enough to avoid decomposition of the gaseous carbonyl etch product. This is generally from about 75° C. to 225° C. Alternatively, the elements may be annealed above about 150° C. in the presence of carbon monoxide, whereby to enhance low temperature carbon monoxide etch rates, i.e., carbon monoxide etch rates at temperatures below 75° C.

Figure 3H:
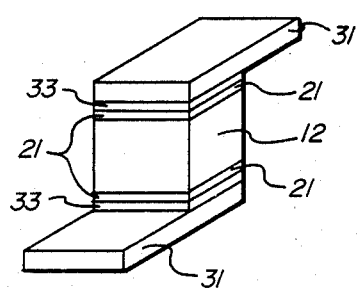

The resulting thermoelectric device is shown schematically in FIG. 3h where clean surfaces, free of diffusion barrier layer material are between the two straps 31, and a diffusion barrier is shown between the welded joint 33 and the thermoelectric body 12.

Figure 4:
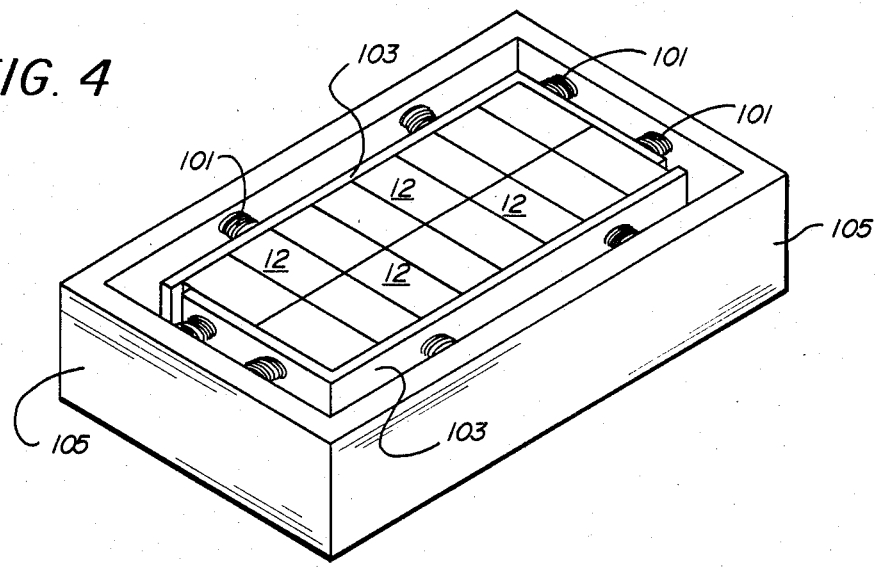
FIG. 4 is an isometric view of a jig for holding individual thermoelectric elements in compression during application of the multi-layer diffusion barrier thereto.

In the exemplification shown in FIG. 4, the individual thermoelectric bodies 12 are held in edge-to-edge contact in compression, e.g., by springs 101 and spacer bars 103 in jig 105. The entire assembly of jig 105 and thermoelectric bodies 12 is subjected to the above multi-layer diffusion barrier coating deposition process, with the conducting surfaces of the thermoelectric bodies exposed to the deposition process, and the non-conducting surfaces shielded therefrom. By this expedient which avoids deposition of barrier material on the non-conducting surfaces, it is unnecessary to remove barrier coating material therefrom.

EXAMPLES

The following examples are illustrative of the methods and devices of the invention.

EXAMPLE I

A series of tests were conducted to determine the effects of electroless deposited nickel single layers as diffusion barriers for chalcogenides. In each test a thermoelectric element of N type semiconductivity was immersed in an Allied Corporation KELITE (TM) hypophosphite plating bath.

The thermoelectric elements were four millimeters by four millimeter by one millimeter elements formed of a disordered material having the nominal stochiometry of 30 to 40 atomic percent bismuth, 2 to 10 atomic percent selenium, 40 to 60 atomic percent tellurium, and about 0.25 atomic percent silver. The thermoelectric elements were electrolessly plated with the nickel for 7, 15, and 30 minutes.

Figure 5:
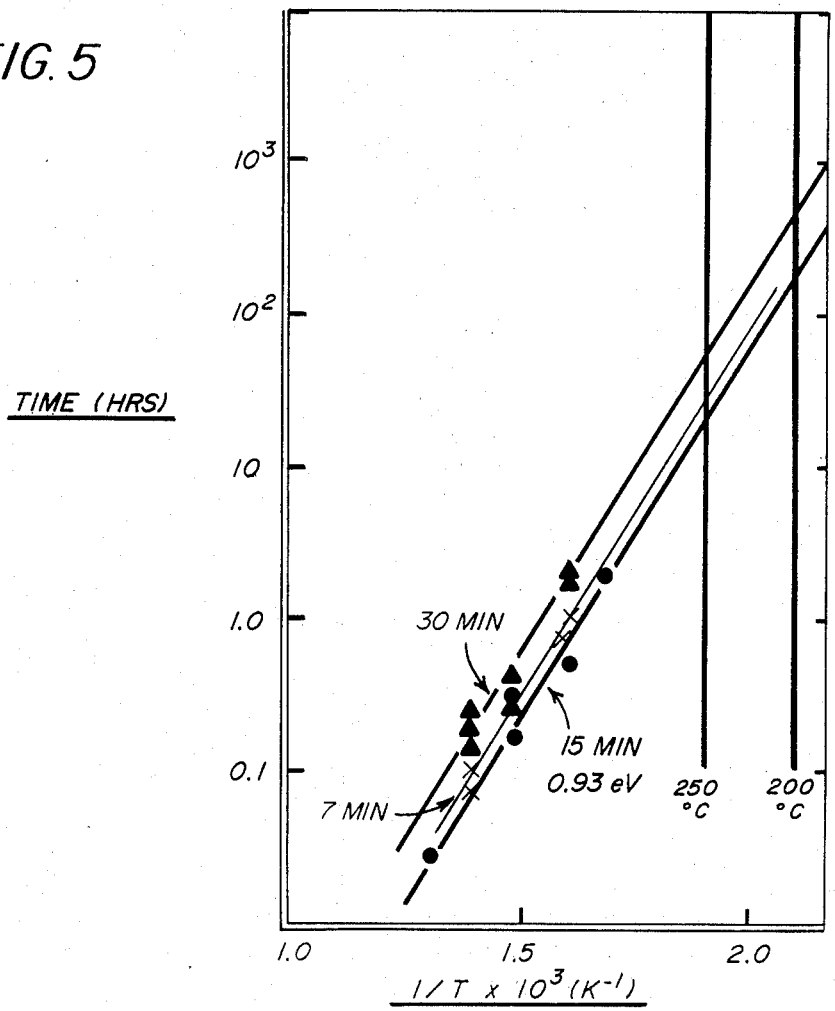
FIG. 5 is a graphical representation of activation energy for the outmigration (exmigration) of tellurium through single nickel barrier layers of various thicknesses.

The elements were then removed from the plating solution and placed in contact with copper sheets. The elements, placed on the copper sheets were then heated at various temperatures between 200 degrees Centigrade and 475 degrees Centigrade until the copper discolored due to the formation of copper telluride—copper selenide. The tellurium and selenium reacted with the copper by diffusing through the barrier layer and subliming from the barrier layer surface. The time to discoloration was plotted as a function of inverse temperature. The plots were parallel, showing that the diffusional activation energy is not a function of thickness. The plot is reproduced in FIG. 5. It can be concluded the increasing the thickness of a single nickel layer alone does not increase the effectiveness of the layer.

EXAMPLE II

A series of tests were conducted to determine the effects of multiple diffusion barrier layers on the diffusional activation energy of chalcogenides through the barrier coating. The layers included electroless deposited nickel, sputtered stainless steel, and sputtered molybdenum.

The thermoelectric elements were 4 millimeter by 4 millimeter by 1.0 millimeter thermoelectric elements of N-type semiconductivity. They were formed of a disordered material having the nominal stochiometry of (1) 99 percent of 40 atomic percent bismuth, 10 atomic percent selenium, and 50 atomic percent tellurium, (2) mixed with one percent Ag, Sb, $Te_2$.

For each nickel layer, a thermoelectric element was immersed in an Allied Corporation KELITE (TM) hypophosphite plating bath. The thermoelectric elements were electrolessly plated with the nickel for 7, 15 and 30 minutes.

For each molybdenum and stainless steel layer, the thermoelectric elements were placed in a sputtering machine with a molybdenum or stainless steel sputtering target, and sputtered under an argon sputtering atmosphere.

After sputtering and/or electroless deposition, the elements were placed on copper sheets. The elements, on copper sheets, were then heated at various temperatures between 200 degrees Centigrade and 475 degrees Centigrade until the copper discolored due to the formation of copper telluride—copper selenide. The time to discoloration was plotted as a function of inverse temperature.

Figure 6:
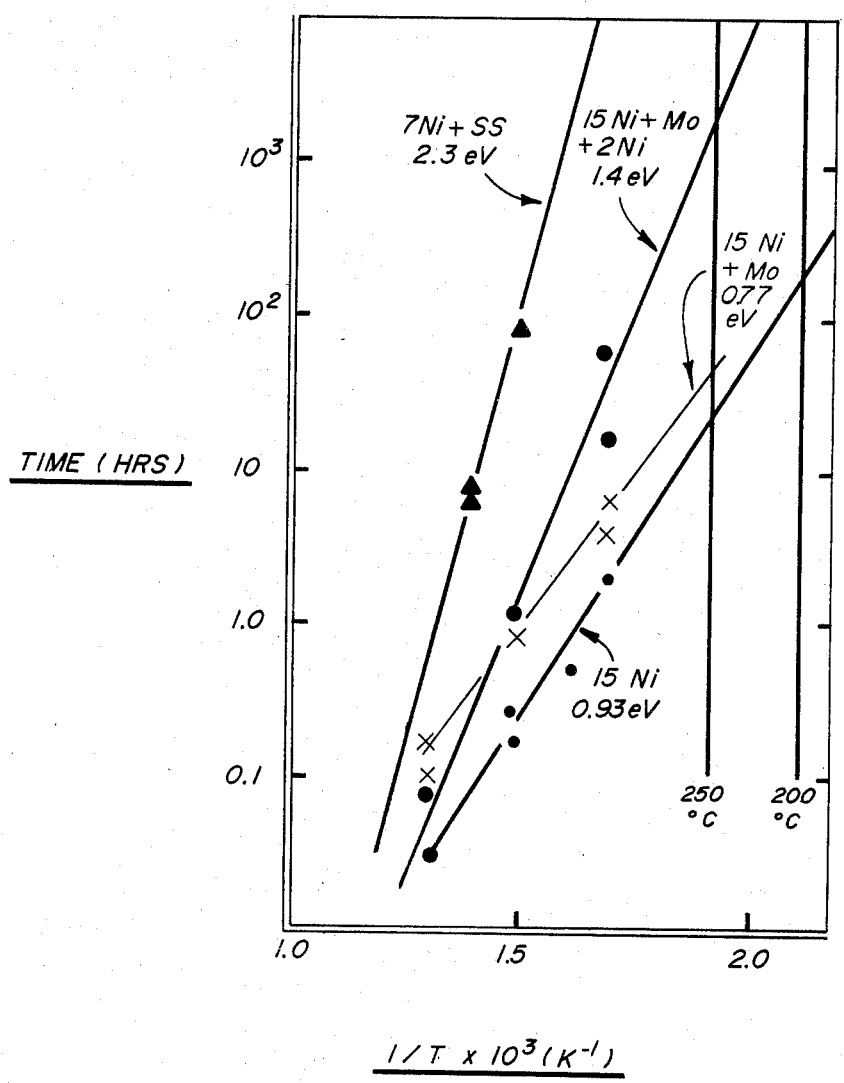
FIG. 6 is a graphical representation of activation energy for the outmigration (exmigration) of tellurium through various barrier materials.

The plot is reproduced in FIG. 6. The plot shows that diffusional activation increases with both the number of layers and the heterogeneity of the layers.

While the invention has been described with respect to certain preferred exemplifications and embodiments it is not intended to limit the scope of protection thereby but solely by the claims dependent hereto.

What we claim is:

1. A method of forming a thermoelectric element comprising the steps of:
   (a) forming a thermoelectric body having two electrical contact surfaces thereon; and
   (b) forming a multilayer diffusion barrier on the thermoelectric body, said multi-layer diffusion barrier comprising:
      (1) a first nickel layer in contact with the thermoelectric body;
      (2) a layer of cobalt atop the first nickel layer; and
      (3) an external layer of nickel atop the cobalt layer.

2. The method of claim 1 comprising removing diffusion barrier layer material from surfaces other than the electrical contact surfaces of the thermoelectric body.

3. The method of claim 1 wherein the thermoelectric body has macroscopic disorder.

4. The method of claim 1 wherein the thermoelectric body comprises tellurium.

5. The method of claim 1 wherein both nickel layers are deposited by a process chosen from the group consisting of plasma spraying, sputtering, evaporation, electrolytic deposition, electroless deposition, and chemical vapor deposition.

6. The method of claim 5 wherein both nickel layer are electrolessly deposited.

7. The method of claim 6 wherein both nickel layer are electrolessly deposited from a hypophosphite solution.

8. The method of claim 5 wherein a nickel layer is formed by chemical vapor deposition.

9. The method of claim 1 wherein the cobalt is deposited by a process chosen from the group consisting of plasma spraying, thermal spraying, sputtering, evaporation, electrolytic deposition, electroless deposition, and chemical vapor deposition.

10. The method of claim 9 comprising depositing the cobalt layer by chemical vapor deposition.

11. The method of claim 10 comprising depositing the cobalt by chemical vapor deposition of a cobalt carbonyl compound.

12. The method of claim 10 wherein the cobalt carbonyl compound is chosen from the group consisting of $Co_2(CO)_8$ and $Co(CO)_3(NO)$.

13. The method of claim 9 comprising depositing the cobalt layer by electroless deposition.

14. The method of claim 1 comprising annealing the element after deposition of each layer.

15. The method of claim 1 comprising removing barrier layer material as a gaseous carbonyl from surfaces of the thermoelectric body other than the electrical contact surfaces thereof.

16. The method of claim 15 comprising activating barrier layer material, and thereafter contacting the activated barrier layer with carbon monoxide whereby to form carbonyls of barrier layer material.

17. A method of forming a thermoelectric element comprising the steps of:
   (a) forming a thermoelectric body having two electrical contact surfaces thereon;
   (b) forming a multi-layer diffusion barrier on the thermoelectric body by:
      (1) depositing a first nickel layer on the thermoelectric body;
      (2) depositing a cobalt layer atop the first nickel layer; and
      (3) depositing a second nickel layer atop the cobalt layer; and
   (c) removing the multilayer diffusion barrier from surfaces of the thermoelectric body other than the electrical contact surfaces.

18. The method of claim 17 wherein the nickel layer is deposited by a method chosen from the group consisting of plasma spraying, thermal spraying, evaporation, sputtering, electroless deposition, electrolytic deposition and chemical vapor deposition.

19. The method of claim 18 wherein the nickel layer is electrolessly deposited.

20. The method of claim 19 wherein the nickel layer is electrolessly deposited from a hypophosphite solution.

21. The method of claim 18 wherein the nickel layer is deposited by electroless deposition.

22. The method of claim 17 comprising annealing the element after deposition of each layer.

23. The method of claim 17 wherein the cobalt is deposited by a method chosen from the group consisting of plasma spraying, thermal spraying, sputtering, electroless deposition, electrolytic deposition, and chemical vapor deposition.

24. The method of claim 23 comprising depositing the cobalt by chemical vapor deposition.

25. The method of claim 24 comprising depositing the cobalt by chemical vapor deposition of a cobalt carbonyl compound.

26. The method of claim 25 wherein cobalt carbonyl compound is chosen from the group consisting of $Co_2(CO)_8$ and $Co(CO)_3(NO)$.

27. The method of claim 23 comprising depositing the cobalt by electroless deposition.

28. The method of claim 17 comprising removing barrier layer material as a gaseous carbonyl from surfaces of the thermoelectric element other than the electrical contact surfaces thereof.

29. The method of claim 28 comprising activating barrier layer material, and thereafter contacting the activated barrier layer with carbon monoxide whereby to form carbonyls of barrier layer material.

30. A method of forming a thermoelectric element comprising the steps of:
  (a) forming a thermoelectric body comprising a macro-disordered tellurium alloy, and having two electrical contact surfaces thereon;
  (b) depositing a first nickel layer from a hypophosite solution onto the thermoelectric body;
  (c) annealing the first nickel layer;
  (d) depositing a cobalt layer by chemical vapor deposition of a cobalt carbonyl onto the first nickel layer;
  (e) annealing the cobalt layer;
  (f) depositing a second nickel layer from a hypophosphite solution onto the cobalt layer whereby to form a multilayer diffusion barrier of said first nickel layer, said cobalt layer, and said second nickel layer;
  (g) annealing the second nickel layer;
  (h) activating the multilayer diffusion barrier on surfaces of the thermoelectric body other than the electrical contact surfaces; and
  (i) contacting the activated multilayer diffusion barrier with carbon monoxide whereby to form carbonyls thereof.

* * * * *